(12) United States Patent
Huott et al.

(10) Patent No.: US 8,055,960 B2
(45) Date of Patent: Nov. 8, 2011

(54) SELF TEST APPARATUS FOR IDENTIFYING PARTIALLY DEFECTIVE MEMORY

(75) Inventors: William V Huott, Holmes, NY (US); David J Lund, Staatsburg, NY (US); Kenneth H Marz, Poughkeepsie, NY (US); Bryan L Mechtly, Red Hook, NY (US); Pradip Patel, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 945 days.

(21) Appl. No.: 12/027,702

(22) Filed: Feb. 7, 2008

(65) Prior Publication Data
US 2009/0204762 A1    Aug. 13, 2009

Related U.S. Application Data

(62) Division of application No. 11/008,371, filed on Dec. 9, 2004, now Pat. No. 7,366,953.

(51) Int. Cl.
*G11C 29/00* (2006.01)
*G01R 31/28* (2006.01)

(52) U.S. Cl. ......... 714/723; 714/710; 714/718; 714/733

(58) Field of Classification Search ........... 714/724–733
See application file for complete search history.

(56) References Cited

U.S. PATENT DOCUMENTS

| | | | |
|---|---|---|---|
| 4,523,313 A | 6/1985 | Nibby, Jr. et al. |
| 4,992,984 A | 2/1991 | Busch et al. |
| 5,070,502 A | 12/1991 | Supnik |
| 5,659,551 A | 8/1997 | Huott et al. |
| 5,805,789 A | 9/1998 | Huott et al. |
| 5,835,502 A | 11/1998 | Aipperspach et al. |
| 5,835,504 A | 11/1998 | Balkin et al. |
| 5,953,745 A | 9/1999 | Lattimore et al. |
| 5,958,068 A | 9/1999 | Arimilli et al. |
| 6,006,311 A | 12/1999 | Arimilli et al. |
| 6,125,465 A | 9/2000 | McNamara et al. |
| 6,173,357 B1 | 1/2001 | Ju |

(Continued)

FOREIGN PATENT DOCUMENTS

EP    0632380 A1    1/1995

(Continued)

OTHER PUBLICATIONS

T. Jaber et al. "Using Partially Good Data Cache VLSI Chips in an Environment of Flexible System Configuration", IBM Technical Disclosure Bulletin, vol. 32, No. 12, May 1990, pp. 139-141.

(Continued)

*Primary Examiner* — Jeffrey A Gaffin
*Assistant Examiner* — Daniel McMahon
(74) *Attorney, Agent, or Firm* — John E. Campbell

(57) ABSTRACT

A computing system is provided which includes a processor having a cache memory. The cache memory includes a plurality of independently configurable subdivisions, each subdivision including a memory array. A service element (SE) of the computing system is operable to cause a built-in-self-test (BIST) to be executed to test the cache memory, the BIST being operable to determine whether any of the subdivisions is defective. When it is determined that one of the subdivisions of the cache memory determined defective by the BIST is non-repairable, the SE logically deletes the defective subdivision from the system configuration, and the SE is operable to permit the processor to operate without the logically deleted subdivision. The SE is further operable to determine that the processor is defective when a number of the defective subdivisions exceeds a threshold.

6 Claims, 2 Drawing Sheets

U.S. PATENT DOCUMENTS

| | | |
|---|---|---|
| 6,222,211 B1 | 4/2001 | Chen |
| 6,351,789 B1 | 2/2002 | Green |
| 6,671,644 B2 | 12/2003 | Huismann et al. |
| 6,671,822 B1 | 12/2003 | Asher et al. |
| 6,675,319 B2 | 1/2004 | Chen |
| 6,720,652 B2 | 4/2004 | Akram et al. |
| 6,918,071 B2 | 7/2005 | Cherabuddi et al. |
| 6,954,827 B2 | 10/2005 | Park et al. |
| 2003/0088811 A1 | 5/2003 | Cherabuddi et al. |
| 2004/0088603 A1 | 5/2004 | Asher et al. |

FOREIGN PATENT DOCUMENTS

| | | |
|---|---|---|
| JP | 1014797 | 1/1989 |

OTHER PUBLICATIONS

K. Massoudian et al. "Dynamic Remapping of Bad Memory Segments During Power-On Self-Test in a PS/2 System", IBM Technical Disclosure Bulletin, vol. 33, No. 11, Apr. 1991, p. 217.

SELF TEST APPARATUS FOR IDENTIFYING PARTIALLY DEFECTIVE MEMORY

RELATED APPLICATION

This application is a division of U.S. patent application Ser. No. 11/008,371, filed Dec. 9, 2004, now U.S. Pat. No. 7,366,953 entitled "SELF TEST METHOD AND APPARATUS FOR IDENTIFYING PARTIALLY DEFECTIVE MEMORY", issued Apr. 29, 2008.

BACKGROUND OF THE INVENTION

The present invention is directed to computing systems, and more specifically to an apparatus and method of identifying and logically deleting a defective subdivision of a cache of a computing system.

Increased business reliance on computers today has made it vital for many computers, particularly server computers, to remain operative continuously, twenty-four hours a day. However, inevitably, a defect occurs in a computer that disrupts a service being provided by the computer. Nowadays, a service interruption or even a slow-down in service provided by a computer can cause an interruption in the business, which potentially costs the business owner much more than the cost of repairing the computer. Perhaps more than other elements of a computer, memory elements become defective during use. For some defects, the impact to a business can be significant, if the system is rendered inoperative by the defect and requires the memory element to be replaced before the system can be operated again.

One way that industry has addressed this concern is to strive for more reliable memory design and production. However, as the density and scale of integration of memory elements increase, it is inevitable that there will be some defects that require the memory element to be replaced, in order to make the repair. It is the system downtime for repairs of these types of defects that still needs to be addressed. These concerns are felt particularly strong with respect to cache memory utilized by a processor. Cache memory is used to provide quick access to frequently referenced and manipulated data and instructions. A level one (L1) cache memory (hereinafter, "cache memory") typically is integrated in a processor element of a computing system. A processor requires a cache memory having some minimum number of memory locations in order to achieve best processing performance.

When the cache memory becomes defective for one reason or another, conventional approaches have permitted individual storage elements of a cache memory such as wordlines and columns to be internally deleted and/or replaced by redundancy elements, in order to permit the processor to be operated again after detecting a permanent defect. In recent years, improved testing and internal self-repair mechanisms have permitted this type of repair operation to be performed by the computer system itself. However, self-repair is generally not available to replace large portions of a cache memory. In addition, self-repair cannot remedy a condition in which a normally repairable portion of a cache memory fails but cannot be repaired because all available repair actions have already been used. When a portion of a cache memory becomes defective in a manner that cannot be repaired by internal mechanisms, the conventional response is to declare the entire cache memory defective when this defect is discovered during the self-test step of powering-on the computer. This then usually requires that the entire processor that utilizes the cache memory be taken offline, i.e., removed from the system configuration. In some instances, the response requires that the entire computing system, having multiple processors, be powered down, and not merely the processor that has the failing cache memory. The computing system would then await repair by physical removal of a part of the system containing the failing processor and replacement thereof by a failure replaceable unit (FRU). Clearly, such outcome was undesirable, as it caused reduced availability of the system to the customer, or even complete unavailability. A far more desirable outcome would be to permit the computing system to retain the processor having the failing subsection of the cache memory in the configuration and continue operating, and logically (but not physically) remove the failing subsection of the cache memory from the configuration instead.

In view of the foregoing, it would be desirable to provide a mechanism by which an unrepairable subsection of a cache memory is identified and logically deleted from the configuration of the computing system, to permit the computing system to continue operating with greater system availability than heretofore.

SUMMARY OF THE INVENTION

The recitation herein of a list of desirable objects which are met by various embodiments of the present invention is not meant to imply or suggest that any or all of these objects are present as essential features, either individually or collectively, in the most general embodiment of the present invention or in any of its more specific embodiments.

According to an aspect of the invention, a computing system is provided which includes a processor having a cache memory. The cache memory includes a plurality of independently configurable subdivisions, each subdivision including a memory array. A service element (SE) of the computing system is operable to cause a built-in-self-test (BIST) to be executed to test the cache memory, the BIST being operable to determine whether any of the subdivisions is defective. When it is determined that one of the subdivisions of the cache memory determined defective by the BIST is non-repairable, the SE logically deletes the defective subdivision from the system configuration, and the SE is operable to permit the processor to operate without the logically deleted subdivision. The SE is further operable to determine that the processor is defective when a number of the defective subdivisions exceeds a threshold.

According to another aspect of the invention, a method is provided for identifying partially good cache memory of a computing system at time of power-on. Such method includes performing built-in-self-test on the cache memory at the time of power-on to determine a number of defective subdivisions present in the cache memory of different types. A number of the defective subdivisions of the different types which are not repairable by an on-chip self-repair technique are determined. The number of the non-repairable defective subdivisions are reported to a service element; and the non-repairable defective subdivision is logically deleted from a configuration of the computing system such that the computing system is powered up and operated normally without the logically deleted subdivision.

DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION OF THE INVENTION

The embodiments of the invention described herein provide a system and method of identifying and logically deleting a defective subdivision of a cache memory, such as a set portion, at time of powering up a computing system, to allow the computing system to continue operating despite the occurrence of the failing subdivision. This contrasts with conventional testing, which heretofore would have required the computing system to remain inoperative, or to operate without a processor of the system that contains the defective set portion, until the computing system is repaired by replacing the chip containing the defective set portion with a good chip.

Figure 1:
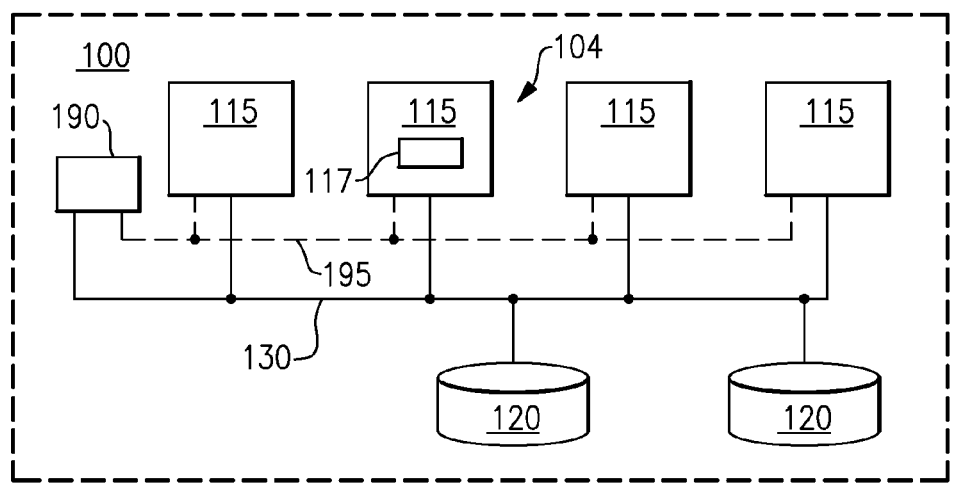
FIG. 1 is a diagram schematically illustrating a computing system in which an embodiment of the invention is implemented.

As illustrated in FIG. 1, the computing system 100 is organized as a cluster 104 of processor nodes 115. For ease of reference, only one cluster 104 is shown in system 100. However, the system can include a plurality of such clusters linked together for handling processing tasks of different sizes, the tasks typically varying as to the particular resources needed to execute them. As shown in FIG. 1, cluster 104 includes a plurality of processor nodes 115, each of which can include one or more processors which cooperate together in executing computing tasks. Each processor node 115 also typically includes one or more local or main memory components, displays, printers, input output (I/O) devices or computer devices that are networked together. A communication network 130 provides communication between the processor nodes 115, as well as between the processor nodes and one or more storage units 120, as shown. The communication network 130 can be simple, including few links and nodes, or more complex, having buses, routers, high capacity lines, switches and/or other such networking elements. Storage units 120 provide secondary and/or tertiary storage of information which can be accessed by processor nodes 115 when executing tasks. The storage units 120 are most typically utilized by a process known as a memory manager or a "data mover". Such data mover processes move data to and from a storage unit 120 and a user buffer 117 supporting a task on a processor node 115, the user buffer 117 providing local storage of data and instructions used during execution of a task by the processor node 115.

As further illustrated in FIG. 1, computing system 100 includes a programmable service element (SE) 190 coupled to the processor nodes 115 through the communication network and/or through a secondary interface such as a scan interface 195. The service element 190 functions to monitor the operation of the processor nodes 115 of the cluster 104 during both normal operation and resets, including operations to power up and power down the cluster. The service element makes certain repairs in the system in response to abnormal conditions which may occur. The service element also manages the configuration of hardware and firmware elements within the cluster, such as the number of processors and amount of local memory configured on each node 115, as well as the total amount of secondary storage 120 available to the cluster 104.

Figure 2:
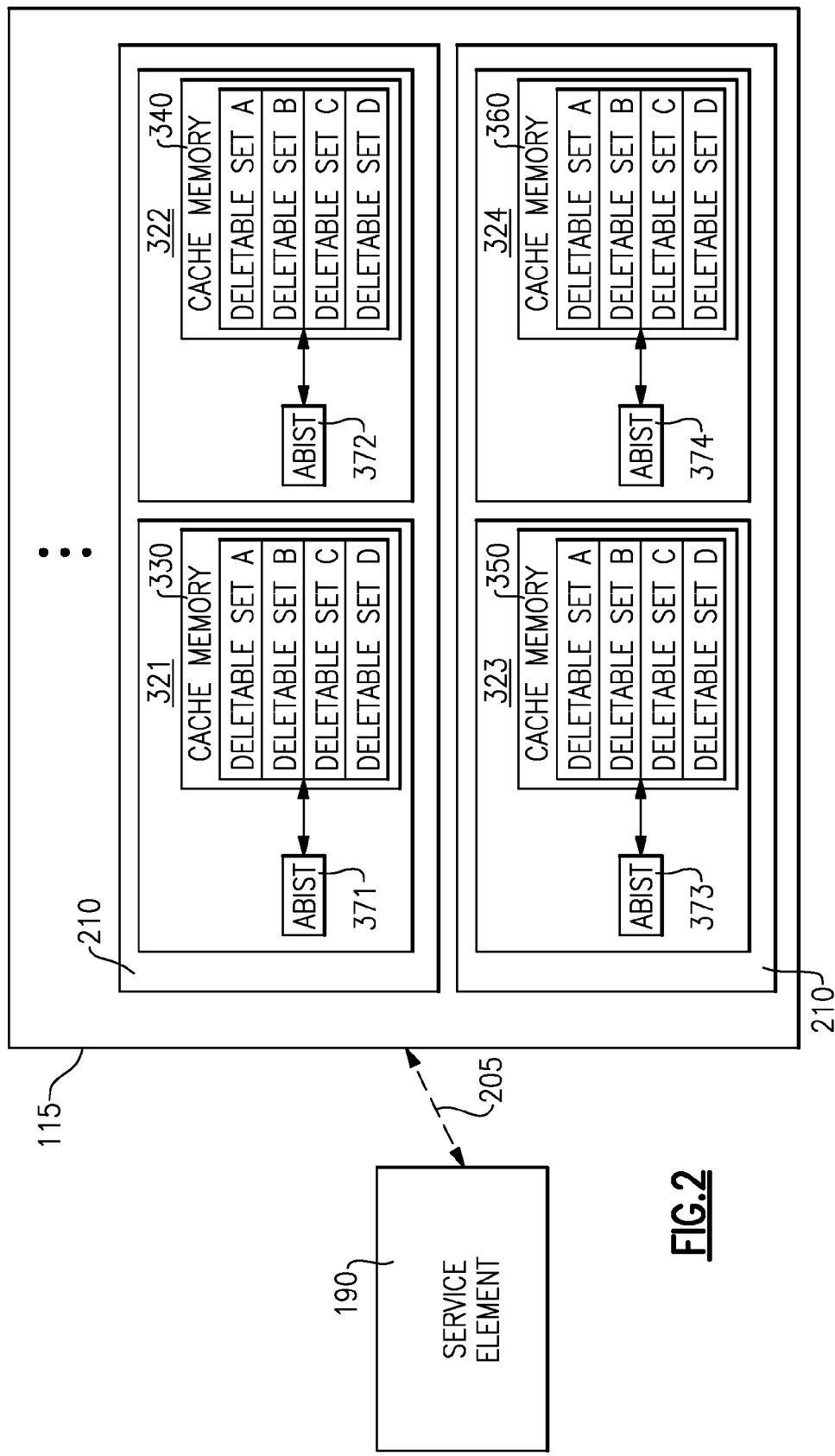
FIG. 2 is a diagram schematically illustrating an internal organization of a computing system according to an embodiment of the invention.

FIG. 2 illustrates an internal organization of processor node 115 of the above-described cluster, as connected to the service element 190 over an interface 205, which may includes a portion of the communication network 130 and/or a portion of the scan interface 195, as described above with reference to FIG. 1. As shown in FIG. 2, the processor node includes a plurality of processor chips 210. Each chip 210, in turn, is an integrated circuit which includes two processor cores. For example, one chip 210 includes two processor cores 321 and 322, and another chip 210 includes two other processor cores 323 and 324. Each processor core implements the function of a central processing unit (CPU) or other processing unit of the cluster. Specifically, each processor core executes instructions to perform processing tasks, such as the manipulation and/or transfer of data. The processor node 115 may include from one to many such chips 210 in configurations ranging from a "one-way" processor node having one configured CPU on one chip 210 to a "16-way" processor node, for example, having sixteen CPUs provided on eight such chips 210.

As further shown in FIG. 2, each processor core includes a cache memory. For example, processor core 321 includes a cache memory 330. The cache memory 330 is an N-way set associative cache memory. In the particular embodiment shown in FIG. 2, the cache memories 330, 340, 350 and 360 of the processor cores 321, 322, 323 and 324, respectively, are each four-way set associative. An N-way set associative cache memory has N "sets" of locations, each set representing an address space which is the same as the other N−1 sets of the cache memory. The number "N" is a matter of design choice, but is preferably a power of two, which can vary from N=two to a much larger number, such as N=16, for example. In a four-way set associative cache memory, two address bits are presented to a cache controller (not shown) to select which one set of the four sets that the location specified by an address is to be found. N-way set associative cache memories are utilized in systems to increase the speed of access to cache, by decreasing the amount of time required to translate and/or decode an address prior to accessing the data stored in the cache. Thus, in such cache memory, accessing of the data stored in one location of each of the four sets generally begins before the cache controller has finished translating and/or decoding the final two address bits. In such manner, the final selection is made from data already retrieved from locations in all of the sets.

As further shown in FIG. 2, an "array built-in self-test" (ABIST) module is associated with each processor core. For example, ABIST 371 is associated with processor core 321. Desirably, a separate instance of the ABIST is implemented on each processor core. The ABIST contains hardware and software elements which test functions of elements such as the cache memory that are implemented in array form on the processor core. Each processor core typically also includes a "logic built-in self-test" (LBIST) module (not shown), which is used to test functions of logic elements such as an arithmetic logic unit, etc., that is implemented on the processor core.

During normal operation of the processor node 115, each processor core executes tasks, utilizing its own cache memory, such as cache memory 330 utilized by processor core 321. ABIST 371 is not invoked when the processor core 321 operates normally. Instead, the ABIST is invoked during power-on-resets and permissibly at other times, such as in response to a recovery operation. In particular, in each processor core 321, 322, 323, and 324, the ABIST tests operation of the corresponding cache memory to determine whether all locations of the cache memory in the current configuration are usable. Thus, the ABIST performs certain testing such as storing data patterns to the cache memory and thereafter retrieving the data therefrom to determine whether particular addressed locations are all good or faulty.

The ABIST also includes a mechanism for determining the severity of a fault. For example, when an error occurs in an addressed location of the cache, the ABIST logs the location of the error. Each bit stored within the cache memory belongs to a particular addressable "cache line" of the memory. A "cache line" is a unit of data, usually an even multiple number of bytes of data that is transferred to and from a register of a processor and the cache memory. While data transfer between processor and cache memory is performed in terms of cache lines which are defined functionally, data storage within the cache memory is performed in terms of wordlines and columns, which are defined by the physical organization of a memory array. Each bit stored within the cache memory is found at the juncture of a wordline and a column. The ABIST determines whether the error is of a type that appears repairable. By cycling through all of the locations of the cache memory, the ABIST determines which locations are defective and determines the type of action best suited for handling the defect. The ABIST determines whether the defect is of a type that is repairable or is not repairable. The ABIST also makes recommendation as to the type of repair to be performed. This is best explained with an example. A single-bit error can be repaired in the cache memory by determining in which wordline and which column the single-bit error is located, deciding that either that wordline or that column is defective, and then replacing the defective wordline or defective column with a redundancy wordline or a redundancy column provided on the processor core. The repair is typically performed by the service element 190 providing signals over the scan interface 195 which redirect access for the one defective wordline or column to the redundancy element.

On the other hand, when the ABIST detects a number of faults, all of which are present within the same region of the cache memory, the ABIST determines that an entire region of the cache memory needs to be repaired. Such region can include a sub-section of the cache memory containing a plurality of wordlines, or a subsection containing a plurality of columns, or an even larger subsection of the cache memory.

The ABIST reports the results of testing the cache memory to SE 190. The SE then uses the reported information concerning the defective cache element, e.g., wordline, column, and/or subsection, and uses it to perform redundancy replacement to repair the cache memory.

A particular advantage of the embodiments of the invention described herein is that the ABIST is capable of identifying bad subsections of the cache memory which are not repairable, for instance, because they represent too large a portion of the cache memory. However, the ABIST continues testing until all portions of the cache memory have been tested. The ABIST does so during reset operations such as a power-on-reset.

In systems according to the prior art, when a portion of a cache memory is found to be defective and not repairable by redundancy replacement, one common way of handling the defect is to remove the processor which uses the cache memory from the configuration of the system, and attempt to operate the computing system without that processor. However, this way of handling such defect is not always available. In some types of systems, the entire computing system will not power up unless the computing system is configured with all of the processors of its designated configuration.

Thus, in an embodiment of the invention, the ABIST tests for defects in the cache memory at time of powering on the computing system, i.e., at time of a power-on-reset, or at time of powering on a processor of the computing system. A flowchart illustrating operation according to such embodiment of the invention is provided in FIG. 3. As illustrated in step 400, the service element (SE) initiates an operation which powers up the computing system. As indicated in step 410, the SE causes the ABIST modules to execute testing of the array elements including the cache memories of each of the processor cores of the computing system. Similarly, LBIST modules test the logic function of the processors.

As shown at 420, a result of the ABIST testing is a determination of a failure condition, or, alternatively, lack of a failure condition, i.e., a "pass" condition. When the ABIST determines the "pass" condition, that result is provided to the SE, which then continues powering on the computing system, as shown at step 490. However, when the ABIST determines a failure condition, the failure must be handled. One way that the failure can be handled is in accordance with steps 425 and 430. In the step shown at block 425, the ABIST determines whether the failure is repairable by a self-repair mechanism on the chip. Specifically, the failure can be limited to a repairable element of the cache, and manifest itself as one or more defects in a wordline or a column of the cache. In such case, the ABIST indicates the particular element that is failing and an action which is capable of repairing the failing element. If the failure is repairable, the ABIST reports the failure to the SE, as shown at block 430. The SE can then take action in accordance with the reported information to replace an element of the cache memory to remove the failure condition. In most cases, the failure is resolved by such action. However, it happens occasionally that too many such failing elements have already been replaced with redundancy elements. In such case, there may not be a redundancy element available for the SE to replace the failing element. The SE repairs the failing element to the extent that it is able using the available redundancy elements. After the SE either completes the repair, or determines that it cannot, because it does not have a required resource, the SE causes the LBIST and the ABIST to test the processor core again from block 410 of FIG. 3.

However, as a result of testing the ABIST may determine that the failure must be handled differently than that described above, i.e., when the ABIST determines that the failure cannot be repaired using one of the available self-repair mechanisms of the chip. In this case, the failure is handled in accordance with the steps shown in block 440, in combination with block 445 or block 450. The ABIST can reach such result when it determines that the portion of the cache memory that is defective is larger than the size of redundancy elements used to make repairs. For example, when a portion of the cache memory is defective, such as a "set" portion of the N-way set associative cache, the ABIST indicates that set to be defective. This may be the case, either due to a defect in the array portion of the cache memory itself, or a defect in the signal and control interface used to operate the cache memory. Another condition for which the ABIST may determine a "set" portion of the cache memory to be defective is when the number of defects within that particular "set" portion of the cache memory is greater than a threshold.

However, the ABIST does not stop testing the cache memory upon determining that the one "set" portion is failing. The ABIST continues testing until the entire cache memory has been tested and the ABIST determines the good or failing status of all such portions of the cache memory.

Thus, the ABIST may determine that no "set" portions of the cache memory fail, one such set portion is failing, or two or more set portions are failing. As a result of this determination, the ABIST also determines whether the failure can be resolved by the computing system by the SE deleting one "set" portion of the N-way set associative cache memory from the configuration of the system (block 440). This is the case when one set portion fails, but other portions of the cache memory are determined to be not failing.

In such case, the ABIST reports the determination of the one failing set to the SE and the decision that the failure is repairable. At block 445, the SE logs the information regarding the failing set to be deleted. At this step, the SE may perform other repairs to the processor core of the chip, including the replacement of defective wordlines or defective columns of the cache memory. After these repairs have been made, the ABIST preferably tests the condition of the entire cache memory of the chip again from block 410. Occasionally, the repair of defective wordlines or defective columns changes the status of the set portion of the cache memory from failing to good. In such case, upon retesting, the ABIST determines that there no longer is a failing set portion of the array.

When the ABIST determines upon re-testing that the set portion continues to fail, the SE deletes the failing set portion from the system configuration and re-starts the system with the deleted set portion. Preferably, LBIST and ABIST testing are then performed again in accordance with steps illustrated with respect to blocks 410 through 490 of FIG. 3.

On the other hand, when two or more set portions of the cache are found to be failing, the ABIST reports the condition to the SE as unrepairable. In such case, the processor core which contains the two or more failing set portions is determined to be failing and not repairable. At block 450, the SE utilizes the data reported by the ABIST to "delete", i.e., remove, the processor core that contains the failing set portions from the configuration of the system. In some computing systems, a "spare" processor core is provided as an element available to be used in case one processor core fails and cannot be repaired by an on-chip self-repair mechanism. In such system, when one processor core fails, the SE can replace the failing processor core with the spare processor core.

Figure 3:
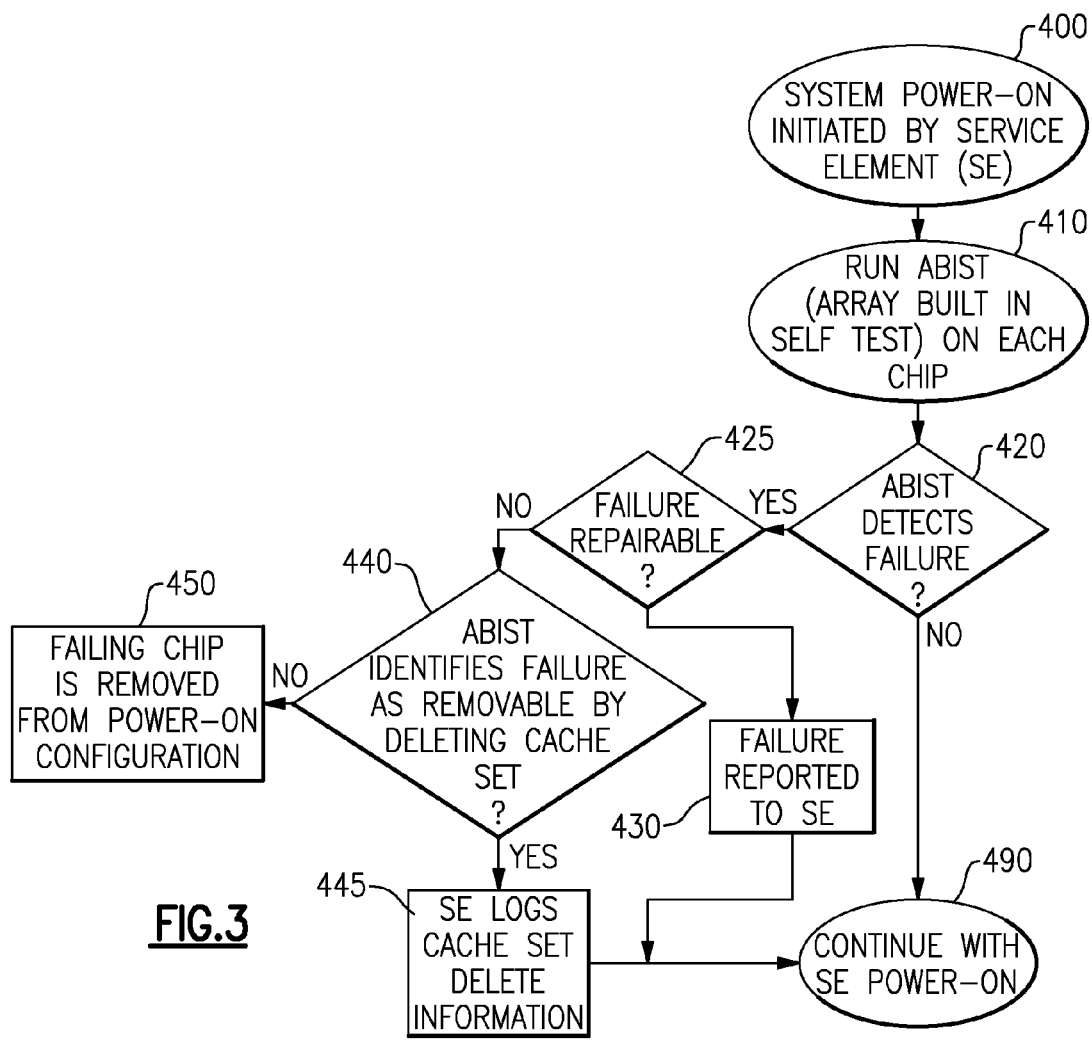
FIG. 3 is a flowchart illustrating a self-test method according to an embodiment of the invention.

After all failing set portions and failing processor cores of the computing system reported by the ABIST have been deleted from the system configuration, or replaced by a spare core, the SE re-initiates a system power-on sequence from block 400, and causes the ABIST to perform testing including performing ABIST testing from block 410 to test the condition of the processor core that has the deleted set portion, and continuing through steps illustrated with respect to blocks 420 through 490 of FIG. 3.

While the above-described embodiment finds its greatest application during the performance of a reset such as a power-on-reset, the invention need not be utilized only upon a power-on-reset. Another way in which the invention can be utilized is during recovery operations which occur during the normal (task-executing) operation of the computing system. During such operation, a number of errors can occur which are determined to be due to failures in a certain region of the cache memory, such as failing wordlines located within a certain set portion of the cache memory. Normally, recovery operations permit the SE to delete a failing wordline from the cache memory configuration to permit the computing system to quickly resume task-executing operation thereafter. In a variation of this procedure, when it is determined that the number of failing elements within a particular set portion of the cache memory exceeds a threshold, the SE can temporarily take the affected processor core offline and invoke ABIST to test the cache memory of the affected processor core. If the ABIST determines that one of the set portions of the cache memory is failing, the SE can then delete the failing set portion from the configuration of the system, in the manner described above with respect to FIG. 3.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

For example, it is not necessary for the SE to be implemented in a separate chip or separate module of the system. In addition, the above-described invention need not be used only in multi-processor systems, but instead may be applied to computing systems which include only a single processor. The above-described function of the service element can even be implemented on the same chip as the processor. In the case of such single processor computing system, when the ABIST determines that a set portion of the cache memory of the single processor system is failing at time of power-on, configuration logic circuitry of such processor can perform the deletion of the failing set portion to allow the processor to continue powering on and to operate.

The invention claimed is:

1. A computing system having a system configuration, said computing system comprising:
   a plurality of processors, each processor of said processors having a service element (SE) and having a cache memory, the cache memory including a plurality of independently configurable subdivisions, each subdivision including a memory array;
   said service element (SE) for each of said processors operable to cause a built-in-self-test (BIST) to be executed to test said cache memory, said BIST operable to determine whether any of said subdivisions is defective, such that:
   (a) said SE is operable to logically delete one of said subdivisions determined defective by said BIST when said one subdivision is non-repairable and said SE is operable to permit its processor to operate without said logically deleted subdivision, and (b) said SE is operable to determine that its processor is a defective one processor when a number of said defective subdivisions exceeds a threshold,
   wherein said cache memory is an N-way set associative cache memory, and said subdivision is a set of said cache memory, and
   wherein said computing system includes a spare processor and said SE is operable to replace its said defective one processor of said computing system with said spare processor and
   said SE is operable to automatically delete a defective one of said sets without intervention by a user, said SE being operable to logically delete said defective set only after said BIST is completed for said cache memory, and
   wherein said SE is operable, upon said BIST determining that two or more of said sets of one processor are defective, to remove said one defective processor from said system configuration.

2. The computing system as claimed in claim 1, wherein said SE is operable to remove said defective processor from said system configuration.

3. The computing system as claimed in claim 1, wherein said SE is operable to cause said BIST to execute upon powering on said computing system.

4. The computing system as claimed in claim 3, wherein said SE is operable to cause said BIST to execute after an error occurs during operation of said computing system.

5. The computing system as claimed in claim 1, wherein said SE is operable to complete powering up said computing system after logically deleting a defective one of said sets.

6. A computing system having a system configuration, said computing system comprising:

a plurality of processor chips, each processor chip including one or more processor cores and a cache memory supporting operation of one of said one or more processors, said cache memory including a plurality of independently configurable subdivisions;

a service element (SE) operable to cause a built-in-self-test (BIST) to be executed on said processor cores, said BIST operable to determine whether one or more of said subdivisions is defective, such that for said processor chips: (a) said SE is operable to logically delete one of said subdivisions from said system configuration when said BIST determines said one subdivision to be defective and said SE is operable to permit said computing system to operate without said logically deleted subdivision, and (b) said SE is operable to determine said processor core to be defective when a number of said defective subdivisions exceeds a threshold number of said defective subdivisions, and wherein said memory further includes means for determining whether a number of said non-repairable defective subdivisions exceeds a threshold for one of said processors, and removing said one processor from said configuration of said computing system when said threshold of said non-repairable defective subdivisions is exceeded, and wherein said cache memory is an N-way set associative memory, and at least one of said types of subdivisions is a set of said cache memory, and further comprising means for removing one defective processor from said system configuration when two or more of said sets of said cache memory of said one processor are determined by said BIST to be defective, and replacing said one defective processor with said spare processor included in said computing system, without requiring said spare processor to be physically moved.

\* \* \* \* \*